United States Patent
Prasad et al.

(10) Patent No.: US 8,255,778 B2
(45) Date of Patent: Aug. 28, 2012

(54) HYBRID ARQ TRANSMISSION METHOD WITH EFFECTIVE CHANNEL MATRIX AND DECISION STATISTICS RESETTING

(75) Inventors: Narayan Prasad, Plainsboro, NJ (US); Xiaodong Wang, New York, NY (US)

(73) Assignee: NEC Laboratories America, Inc., Princeton, NJ (US)

( * ) Notice: Subject to any disclaimer, the term of this patent is extended or adjusted under 35 U.S.C. 154(b) by 786 days.

(21) Appl. No.: 12/435,249

(22) Filed: May 4, 2009

(65) Prior Publication Data

US 2009/0276679 A1  Nov. 5, 2009

Related U.S. Application Data

(60) Provisional application No. 61/049,790, filed on May 2, 2008, provisional application No. 61/049,794, filed on May 2, 2008.

(51) Int. Cl.
  *H03M 13/15* (2006.01)
  *H03M 13/17* (2006.01)
  *H03M 13/45* (2006.01)
(52) U.S. Cl. ......... 714/786; 714/794; 714/795; 714/791
(58) Field of Classification Search .................. 714/786, 714/794, 788, 790, 791, 795
  See application file for complete search history.

(56) References Cited

U.S. PATENT DOCUMENTS

| 4,468,786 | A  | * | 8/1984  | Davis .......................... 375/229 |
| 5,961,658 | A  | * | 10/1999 | Reed et al. ..................... 714/746 |
| 6,009,553 | A  | * | 12/1999 | Martinez et al. .............. 714/784 |
| 6,732,328 | B1 | * | 5/2004  | McEwen et al. .............. 714/795 |
| 7,080,313 | B2 | * | 7/2006  | Akiyama et al. ............. 714/794 |
| 7,634,711 | B2 | * | 12/2009 | Piret et al. ..................... 714/781 |
| 7,853,853 | B2 | * | 12/2010 | Demirhan et al. ............ 714/751 |
| 2008/0095281 | A1 | * | 4/2008 | Hosur et al. ................... 375/347 |
| 2010/0278134 | A1 | * | 11/2010 | Ankel et al. .................. 370/329 |

* cited by examiner

*Primary Examiner* — Joseph Schell
(74) *Attorney, Agent, or Firm* — Joseph Kolodka

(57) ABSTRACT

A method for decoding of multiple wireless signals by a chase combining hybrid-automatic-repeat-request CC-HARQ receiver includes demodulating wireless signals received from respective mobile sources using an effective channel matrix and decision statistics; updating log-likelihood-ratios LLRs and decoding the received codewords using the corresponding updated LLRs; determining set of correctly decoded codewords using a cyclic redundancy check; updating the effective channel matrix and decision statistics responsive to the step of determining; and resetting the effective channel matrix and decision statistics in the event that the number of decoding errors for a codeword exceeds its maximum limit after storing the updated LLRs of all remaining erroneously decoded codewords for which the number of decoding errors is below the respective maximum limit.

8 Claims, 3 Drawing Sheets

HYBRID ARQ TRANSMISSION METHOD WITH EFFECTIVE CHANNEL MATRIX AND DECISION STATISTICS RESETTING

This application claims the benefit of U.S. Provisional Application No. 61/049,794, entitled "Efficient receiver for Chase-Combining Hybrid ARQ", filed on May 2, 2008, and U.S. Provisional Application No. 61/049,790, entitled "SINR Computation for Multi-Codeword Chase Combining Hybrid ARQ Systems", filed on May 2, 2008, the contents of both which are incorporated by reference herein.

BACKGROUND OF THE INVENTION

The present invention relates generally to wireless communications, and more particularly, to a hybrid automatic-repeat-request (HARQ) reception method with channel state information.

HARQ systems combine ARQ and error control coding to achieve high throughput and high reliability. Unlike ARQ systems where packets decoded previously in error are simply discarded, in HARQ systems all the received signals are combined to enhance performance. Chase-combining HARQ (CC HARQ) is a simple HARQ scheme where the transmitter transmits the same codeword (using the same modulation and coding scheme) upon receiving a decoding error message from the receiver.

Referring to the diagram in FIG. 1, we consider a multiple access channel where K users 11-13 communicate with a base station 10 equipped with multiple antennas. The communication system in which the wireless users and base station communicate employs Chase-combining Hybrid-Automatic-Repeat-Request (CC-HARQ), which is a simple HARQ scheme where each user re-transmits its encoded signal, using its original (first transmission) modulation and coding scheme) upon receiving a decoding error message (NACK) from the receiver of the base station 10. An optimal Chase-combiner utilizes received sufficient statistics from all the received signal transmissions to perform pre-demodulation combining in every time slot. It is not suitable for implementation, particularly, in multi-user systems due to its high memory requirement and complexity.

A conventional receiver that is used for chase combining, implements post-demodulation bit-level combining in which the log-likelihood ratios (LLRs) for each coded bit are added up across all received transmissions. An optimal chase combining receiver is also known in the prior art and this receiver implements pre-equalization symbol-level combining. The optimal receiver can offer significant gains over the conventional one since the latter does not fully exploit the available received observations. However, in practice the conventional one is preferred because the optimal receiver requires prohibitive complexity and memory consumption.

Accordingly, there is a need for a Chase-combining hybrid automatic-repeat-request (CC-HARQ) receiver technique that achieves the performance of the optimal receiver technique, but with the memory requirement and complexity of the conventional receiver.

SUMMARY OF THE INVENTION

In accordance with the invention, a method for decoding of multiple wireless signals by a chase combining hybrid-automatic-repeat-request CC-HARQ receiver includes demodulating wireless signals received from respective mobile sources using an effective channel matrix and decision statistics; updating log-likelihood-ratios LLRs and decoding the received codewords using the corresponding updated LLRs; determining set of correctly decoded codewords using a cyclic redundancy check; updating the effective channel matrix and decision statistics responsive to the step of determining; and resetting the effective channel matrix and decision statistics in the event that the number of decoding errors for a codeword exceeds its maximum limit after storing the updated LLRs of all remaining erroneously decoded codewords for which the number of decoding errors is below the respective maximum limit.

BRIEF DESCRIPTION OF DRAWINGS

These and other advantages of the invention will be apparent to those of ordinary skill in the art by reference to the following detailed description and the accompanying drawings.

DETAILED DESCRIPTION

The invention is directed to a hybrid automatic-repeat-request (HARQ) receiver technique that uses a key transformation of the received sufficient statistics in the absence of packet errors, to obtain an equivalent sufficient statistic which is simple to store and update and which allows pre-equalization symbol level combining. In the presence of packet errors, the inventive technique leverages post-demodulation bit-level combining.

We consider a multi-codeword (MCW) chase combining hybrid automatic-repeat-request (CC-HARQ ) system in which K codewords in a signal are first simultaneously transmitted using K physical (or virtual) antennas. These antennas could be co-located at the same transmitter or they could belong to different users. For the sake of exposition, let us assume that each antenna belongs to one user. The transmissions are received by a receiver and the K codewords in signals are then decoded by the receiver. The receiver sends a separate acknowledge/non-acknowledge ACK/NACK signal for every codeword it decodes. Upon receiving an ACK, the user transmits a new codeword whereas upon receiving a NACK signal it re-transmits the same codeword. A packet error is declared for user k, if its codeword cannot be successfully decoded after a maximum number of repetitions. Thus, K codewords of a signal are transmitted in every round. The objective is to design a receiver that can efficiently decode the codewords in signals by utilizing all the received observations and without incurring significant memory or complexity overhead.

Figure 1:
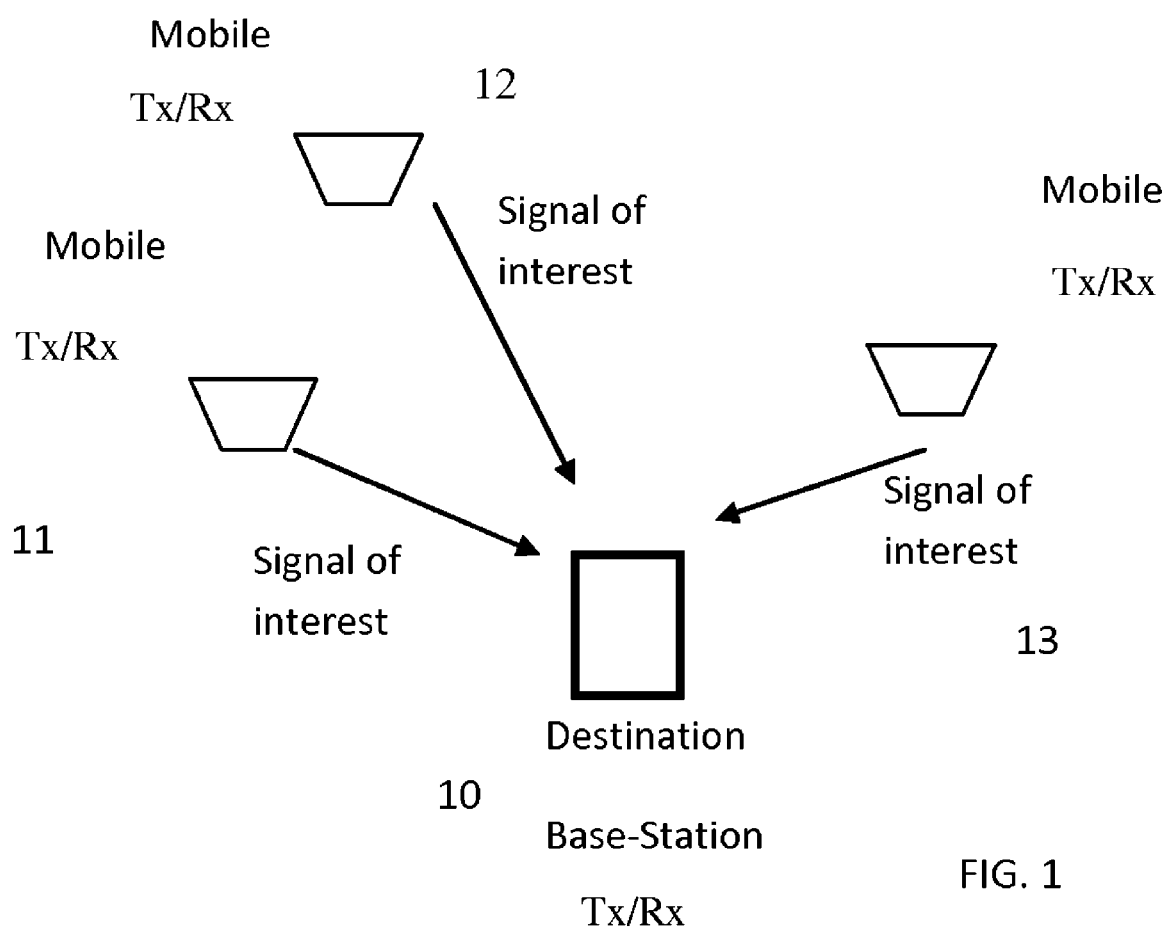
FIG. 1 is a diagram of an exemplary wireless network, with multiple mobile signal sources 11-13 transmitting to a destination base-station 10, in which the inventive receiver technique can be employed.
Figure 2:
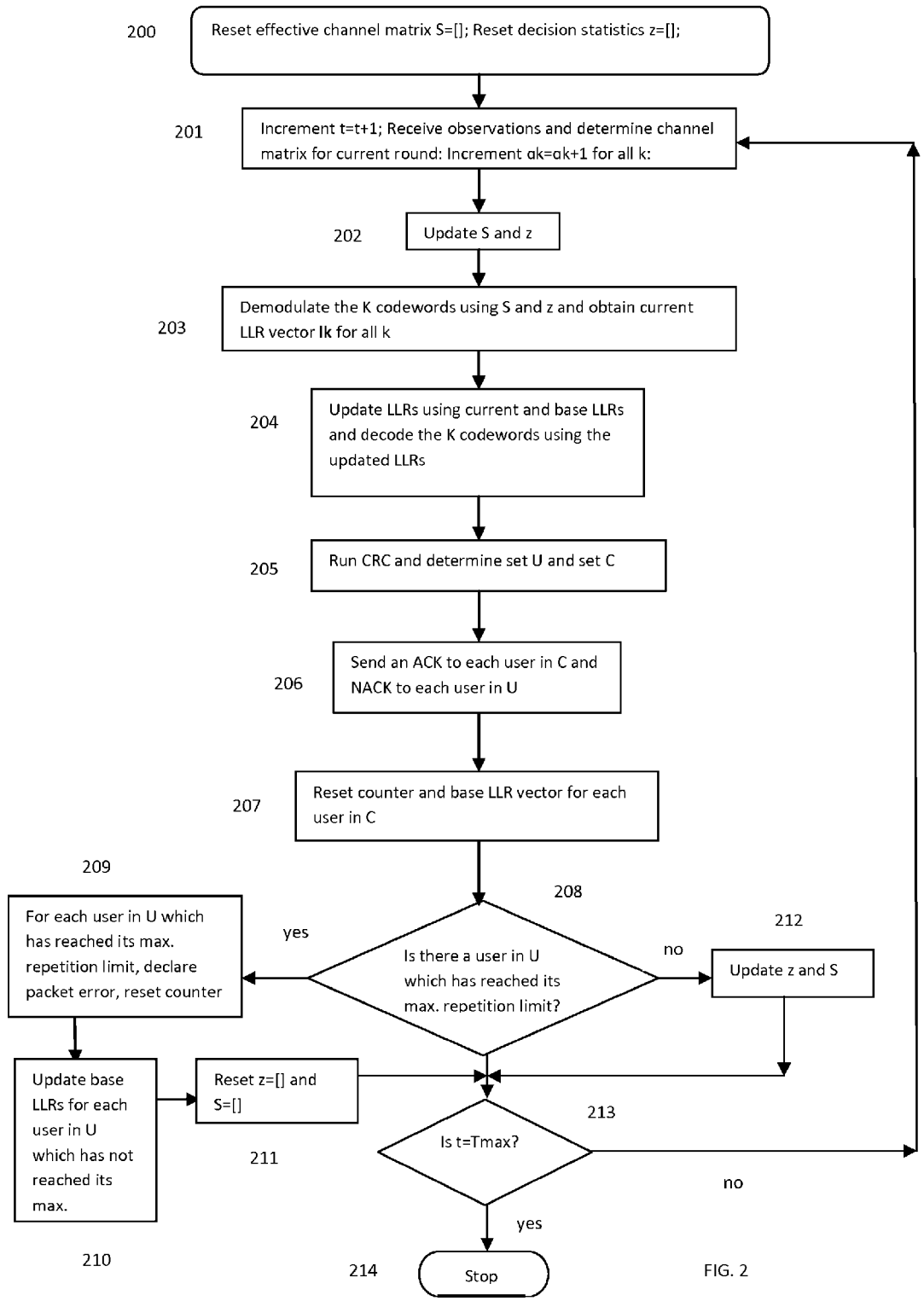
FIG. 2 is a block diagram of chase combining hybrid automatic-repeat-request CC-HARQ receiver signal processing in accordance with the invention.

The chase-combining CC-HARQ receiver is described by the block diagram in FIG. 2. Detailed derivations and analysis are provided after the discussions below respecting FIG. 2. and FIG. 3. The key feature of the inventive receiver technique is that correctly decoded codewords are subtracted from the received observations between two consecutive rounds. The buffers are reset whenever one or more codewords cannot be correctly decoded even after their maximum number of repetitions, after storing the log-likelihood-ratios (LLRs) computed for the remaining erroneously decoded codewords (which have not reached their maximum number of repetitions) as base LLRs. The LLRs for subsequent decoding of such codewords are then obtained as the sum of these base LLRs and the LLRs obtained via pre-equalization symbol level combining which is done using only the subsequent received observations.

Referring again to FIG. 2, a diagram of the inventive CC-HARQ receiver signal processing, initially in step 200 the receiver resets the effective channel matrix S=[ ] and resets the effective decision statistics z=[ ]. For each user k, the receiver sets the counter qk=0 and resets the base LLR vector Lk=0 and it sets t=0. At the next step, 201, the receiver increments t=t+1, receives observations yt and determines the channel matrix Ht for the current round t, and then increments the counter qk=qk+1 for all k users. In the following step, 202, the receiver updates the effective channel matrix S=S+(Ht)*Ht and updates the effective decision statistics z=z+(Ht)*yt, where ( )* denotes a conjugate transpose operation. In the subsequent step 203, the receiver demodulates the K received codewords using the effective channel matrix S and effective decision statistics z, assuming the model z=Sx+v, where x is the K length vector of the transmitted symbols corresponding to the K codewords and v is a Gaussian noise vector with covariance $\alpha$S, where $\alpha$ is a positive scalar.

Then, in the next step 204, the receiver uses updated log-likelihood ratios LLRs lk+Lk to decode the codeword k, where $1 \leq k \leq K$. The receiver then, 205, runs a cyclic redundancy check (CRC) for each decoded codeword. The users whose codewords fail the CRC form the set U and the users whose codewords pass the CRC form the set C. The receiver then 206 sends an acknowledgement to each user k in C and a non-acknowledgement to each user k in U. The receiver then 207 resets the counter and base LLR vector for each user in C.

The receiver in step 208 then checks if there is a user in set U, of users whose codewords failed the cyclic redundancy check, which has reached its maximum repetition limit. If not the effective channel matrix S and effective decision statistics z are updated 212 by first reconstructing (i.e., re-encoding and re-modulating) the correctly decoded codewords corresponding to users in C. Then for each q in the set U of users, the receiver updates $z_q = z_q - \Sigma_{i \in c} S_{qi} \hat{x}_i$. Next, for each k in the set C of users the receiver replaces the row k and column k of S with the K length vector of all zeros. The corresponding decision statistic is set to 0, i.e., $z_k=0$. On the other hand, if there is a user in set U which has reached its maximum repetition limit then the receiver declares a packet error for that user and resets the counter qk and the base LLR vector Lk 209. In the next step 210, the receiver updates the base LLR Lk=Lk+lk for each user k in U which has not reached its maximum repetition limit. Then the effective channel matrix S and effective decision statistics z are reset 211. If the increment timer has not maxed out, then receiver processing returns to step 201 and repeats the subsequent steps 202-212. Otherwise the receiver has finished processing the signals 214.

Figure 3:
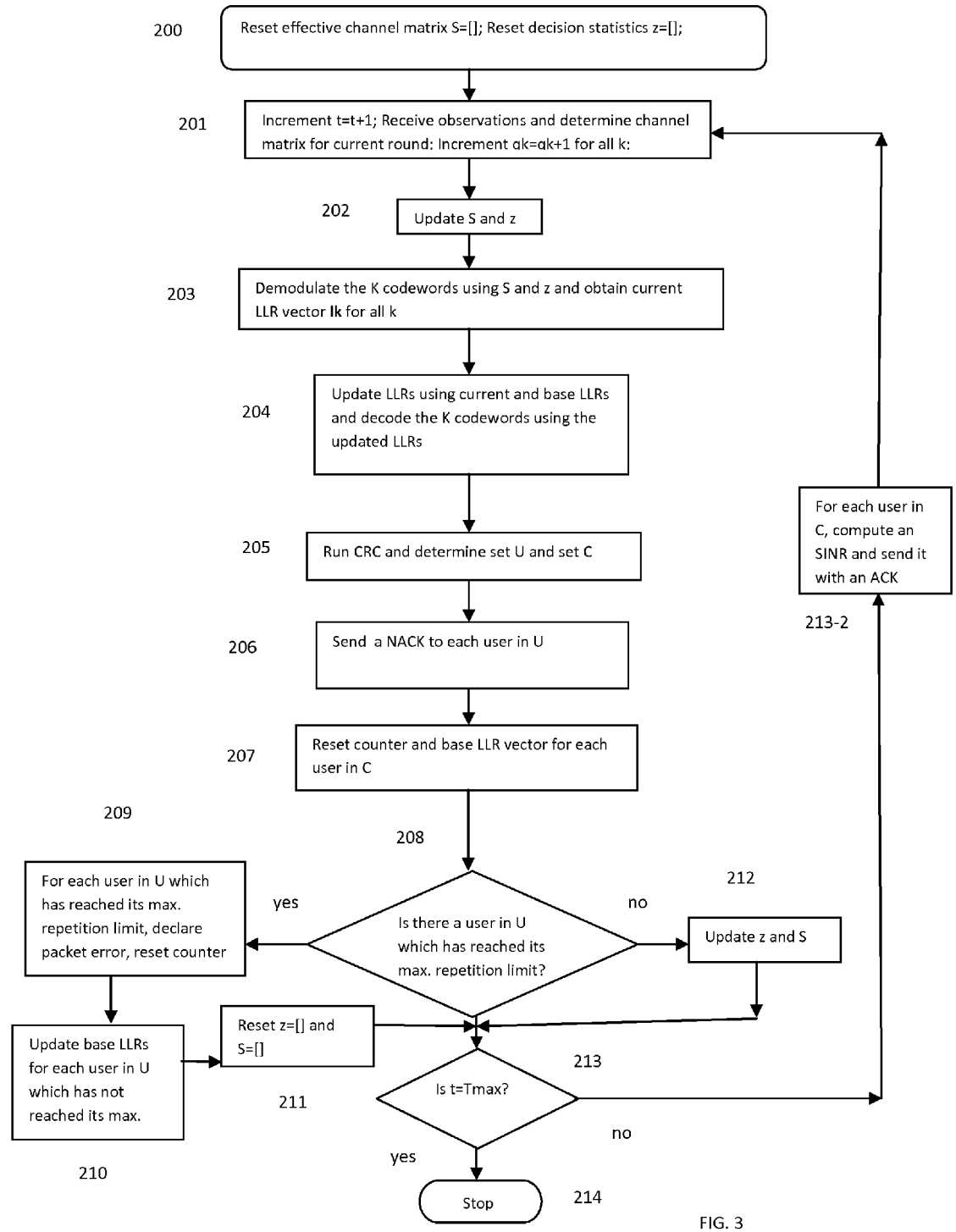
FIG. 3 is a block diagram of the receiver signal processing of FIG. 2 with added SINR feedback, in accordance with the invention.

The diagram of FIG. 3 shows the inventive chase-combining hybrid-automatic-repeat-request CC-HARQ of FIG. 2, with the addition of a signal-to-noise-ratio SINR feedback 213-2 in the repeat path for each incremental processing of steps 201-212. The objective is to compute and feed back an SINR before the start of any round to each user who is supposed to transmit a new codeword in that round. This allows the users to use rates that are well-matched to their received SINRs and hence improve the system throughput. The key advantage in the inventive method is that SINRs for all users whose codewords have been correctly decoded in the current round are computed using the effective channel matrix S, the channel estimates for the next round and by exploiting the fact that the erroneously decoded users that have not reached their maximum respective repetition limits will re-transmit their codewords. Thus, the SINR computation for a user efficiently exploits the information about the interference, i.e., the code words transmitted by other users, that is present in the previous received observations.

A simple complexity reduction feature that can be incorporated in the receiver of FIG. 2 or FIG. 3 is the following. The receiver may choose not to demodulate and decode some or all of the codewords and decide that these codewords were decoded erroneously. Clearly by avoiding demodulating and decoding some or all of the codewords the receiver can reduce the complexity in the current round. The drawback is that such an approach if not used judiciously can increase the packet error rate and reduce the throughput. Nevertheless, using an appropriate rule based on the effective channel matrix, the modulation and coding schemes employed by the users and possibly the decision statistics, the receiver can determine the set of users it will demodulate and decode. It then decides that the codewords of the remaining users were decoded erroneously. Thus the set of users in U is formed by these users along with the users whose codewords were indeed decoded but failed the CRC. An advantage of this approach is that the receiver can avoid demodulating and decoding a codeword for which it deems that an error is very likely.

Chase-Combining Hybrid ARQ

System Model

We consider a narrow-baud multiple access channel model with K users and a base-station equipped with $N_r$ receive antennas. The communication takes place over multiple slots (or rounds) and in any slot each user can transmit at-most one codeword. The channel model for a symbol interval in the $i^{th}$ round (slot) is given by[1]:

$$y_i = H_i s_i + n_i, \qquad (1)$$

where $H_i = [H_{i,1}, \ldots, H_{i,K}]$ is the $N_r \times \Sigma_{k=1}^{K} n_k$ channel matrix with $N_r \geq \Sigma_{k=1}^{K} n_k$ and where $n_k$ is the number of transmit antennas of the $k^{th}$ user. The $N_r \times n_k$ matrix $H_{i,k}$ corresponds to the channel matrix seen by the base-station from user k. $n_i$ is a possibly colored Gaussian noise vector which is independent across different symbol intervals. $s_i = [s_{i,1}; \ldots; s_{i,K}]$ is the vector of transmitted symbols and the $k^{th}$ sub-vector $s_{i,k}$ of length $n_k$, consists of the symbols transmitted by the $k^{th}$ user and its elements are either all zero (when the $k^{th}$ transmitter is silent) or they are symbols drawn from some regular constellation. The model in (1) also describes the channel output seen on any tone in an OFDMA uplink. We now briefly describe the Chase-combining HARQ. In this scheme each user re-transmits the same codeword upon receiving a NACK from the receiver, whereas upon receiving an ACK it either remains silent or transmits a new codeword corresponding to a new message. User p, $1 \leq p \leq K$ is allowed upto $M_r \geq 1$ transmissions for a codeword, which implies that it can re-transmit the same codeword $M_p - 1$ times. Thus, if user p receives more than $M_p - 1$ consecutive NACKs from the receiver, it will start transmitting a new codeword and the receiver will declare a packet error for user p. Note that without loss of generality, we have assumed that each user can transmit at-most a single codeword during any slot since a user transmitting multiple codewords can be split into multiple virtual users transmitting a single codeword each.

CC-HARQ With Blanking

We first consider an MCW CC-HARQ system with blanking. In such a system, $K \geq 1$ codewords are first simultaneously transmitted by the K users, which are then decoded by the receiver. The receiver conducts a cyclic redundancy check (CRC) for every codeword it decodes and sends an ACK to each user whose decoded codeword passed the CRC and a NACK to the remaining ones. Upon receiving a NACK, the user re-transmits its codeword in the next round whereas upon receiving an ACK it remains silent. Consequently, only those, codewords for which a NACK was received are transmitted in the next round. A new set of K codewords can be transmitted either it all codewords have been deemed to be correctly decoded by the receiver or if the maximum codeword transmission limit (which is identical to Q for all codewords) is reached without the successful decoding of at-least one codeword. [2]Let us refer to the round when K new codewords are transmitted as a regeneration round (slot) and suppose round 1 is one such round. Then, the discrete-time model of the signal received during a symbol interval in the first round is given by $$y_1 = H_1 s_1 + n_1, \quad (2)$$

where $H_1 = [H_{1,1}, \ldots, H_{1,K}]$ is the matrix denoting the channel response and $n_1$ models the noise plus interference and is assumed to have a covariance matrix $\Sigma_1$. $s_1 = [s_{1,1}; \ldots; s_{1,K}]$ denotes the transmitted symbol vector. The receiver proceeds to decode the K codewords and conducts a CRC on each decoded codeword. It accordingly sends an ACK or NACK to each user and only the users who received a NACK transmit in the second round. Continuing this way, the discrete-time model of the signal received during a symbol interval in the $i^{th}$ round (prior to the next regeneration round) can be written as $$y_i = H_i s_i + n_i, \quad i \geq 1, \quad (3)$$

where $H_i = [H_{i,1}, \ldots, H_{i,K}]$ is the matrix denoting the channel response and $n_i$ models the noise plus interference and is assumed to have a ovarianee matrix $\Sigma_i$. Let $T_i \subseteq \{1, \ldots, K\}$ denote the set containing the indices of the undecoded codewords at the start of the $i^{th}$ round so that $T_1 = \{1, \ldots, K\}$. The symbol vector $s_i = [s_{i,1}; \ldots; s_{i,K}]$ contains the re-transmitted symbols from the codewords having indices in $T_i$, i.e., $s_{i,j} = s_{1,j}, \forall j \in T_i$ and $s_{i,j} = 0, \forall j \notin T_i$. Thus, without loss of optimality, we can set $H_{i,j} = 0, \forall j \notin T_i$. Post whitening, the model in (3) can be written as:

$$\tilde{y}_i = \Sigma_i^{-1/2} y_i = \tilde{H}_i s_i + \tilde{n}_i, \quad (4)$$

where $\tilde{H}_i = \Sigma_i^{-1/2} H_i = [\tilde{H}_{i,1}, \ldots, \tilde{H}_{i,K}]$.

We now describe memory efficient implementations of the optimal Chase-combining with blanking, which performs pre-equalization symbol-level combining by using the received sufficient statistics. We first consider the case when due to practical constraints the correctly decoded codewords after any round are not canceled from the received observations. Note that to cancel the correctly decoded codewords, we need to re-encode and re-modulate each such codeword prior to subtracting them from the received observations, which may not be feasible due to complexity and/or latency constraints. Then, supposing that round 1 is a regeneration round, the concatenated received observations (for each symbol interval) up to the $i^{th}$ round, which represent the received sufficient statistics, can be modeled as $$\tilde{y}_{(i)} = \tilde{H}_{(i)} s_1 + \tilde{n}_{(i)}, \quad (5)$$

where $\tilde{y}_{(i)} = [\tilde{y}_1; \ldots; \tilde{y}_i]$, $\tilde{H}_{(i)} = [\tilde{H}_1; \ldots; \tilde{H}_i]$, $\tilde{H}_q = [\tilde{H}_{q,1}, \ldots, \tilde{H}_{q,K}]$, $\forall\ 1 \leq q \leq i$ and where we have set $\tilde{H}_{q,j} = 0, \forall j \notin T_q$ & $1 \leq q \leq i$. Note that in the $i^{th}$ round only the codewords in $T_i$ should he decoded so that the LLRs must be generated only for these codewords. Further, no side information on the values or the distributions of the symbols of the already decoded codewords is assumed to be available. The received sufficient statistics in (5) can then be used for equalization (or demodulation) but the naive way of doing so would entail significant memory consumption since all the channel matrices and received observations of the previous rounds need to be stored. A smarter memory efficient implementation follows from the simple but key observation that $\tilde{z}_i = \tilde{H}_i^\dagger \tilde{y}_{(i)}$ also represents sufficient statistics. $\tilde{z}_i$ can be modeled as $$\tilde{z}_i = \tilde{A}_i s_1 + \tilde{v}_i, \quad (6)$$

where $\tilde{A}_i = \sum_{j=1}^{i} \tilde{H}_j^\dagger \tilde{H}_j = \sum_{j=1}^{i} H_j^\dagger \Sigma_j^{-1} H_j$ and the Gaussian vector $\tilde{v}_i$ has a covariance matrix which equals $\tilde{A}_i$. In particular, the LLRs generated using the ML demodulator on $\tilde{y}_{(i)}$ assuming it to be the output of the model in (5), are identical to those generated using the ML demodulator on $\tilde{z}_i$ assuming it to be the output of the model in (6). The same observation also holds for the LMMSE demodulator. Moreover, $\tilde{z}_i$ also permits a simple update $\tilde{z}_i \tilde{z}_{i-1} + \tilde{H}_i^\dagger \tilde{y}_i$.

Next, consider the case when the correctly decoded codewords can be canceled from the received observations during the time interval between two consecutive rounds. Suppose again that round 1 is a regeneration round so that the signal received during a symbol interval in round 1 is given by (2). After the decoding and CRC steps, let U and $C = U^c$ denote the set of correctly and erroneously decoded codewords, respectively. Thus $T_2 = U$ is the set of undecoded codewords at the start of round 2. Now, the receiver can cancel the correctly decoded codewords from the observations received during round 1, i.e., it can obtain $\tilde{y}_1 - \sum_{k \in T_2^c} \tilde{H}_{1,k} \hat{s}_{1,k}$, where $\hat{s}_{1,k}$, $k \in T_2^c$ denotes the decision made for $s_{1,k}$. Then, concatenating with the observations received during round 2, we obtain $$\tilde{w}_{(2)} = \left[ \tilde{y}_1 - \sum_{k \in T_2^c} \tilde{H}_{1,k} \hat{s}_{1,k}; \tilde{y}_2 \right]. \quad (7)$$

In the absence of CRC errors, another simple but key observation is that $\tilde{w}_{(2)}$ represents the sufficient statistics to decode the remaining codewords of users in $T_2$, since the codewords are independent across users. [3]Continuing in this manner, the concatenated received observations post-cancelation for the $i^{th}$ round can be modeled as $$\tilde{w}_{(i)} = \tilde{G}_{(i)} s_i + \tilde{n}_{(i)}, \quad (8)$$

where $\tilde{w}_{(i)} = [\tilde{w}_1; \tilde{w}_2; \ldots; \tilde{y}_i]$ with $\tilde{w}_j = \tilde{y}_j - \sum_{k \in T_i^c} \tilde{H}_{j,k} \hat{s}_{1,k}$, $1 \leq j \leq i-1$ and $\tilde{G}_{(i)} = [\tilde{G}_1; \ldots; \tilde{G}_i]$ with $\tilde{G}_j = [\tilde{G}_{j,1}, \ldots, \tilde{G}_{j,K}]$ where $\tilde{G}_{j,k} = \tilde{H}_{j,k}, \forall k \in T_i$ and $\tilde{H}_{j,k} 0, \forall k \notin T_i$ for $1 \leq j \leq i$. A memory efficient implementation now follows from the fact that $\tilde{x}_i = \tilde{G}_{(i)}^\dagger \tilde{w}_{(i)}$ are also sufficient statistics and can be modeled as $$\tilde{x}_i = \tilde{B}_i s_1 + \tilde{u}_i, \quad (9)$$

where $\tilde{B}_i = \sum_{j=1}^{i} \tilde{G}_j^\dagger \tilde{G}_j$ and the Gaussian vector $\tilde{u}_i$ has a covariance matrix which equals $\tilde{B}_i$. As before, the ML demodulator generates identical LLRs when used on $\tilde{w}_{(i)}$ or $\tilde{x}_i$, after assuming them to be the outputs of the appropriate models. The same observation holds for the LMMSE demodulator as well. Note that $\tilde{x}_i = [\tilde{x}_{i,k}; \ldots; \tilde{x}_{i,K}]$ also permits a simple update: $\tilde{x}_{i,k} = \tilde{x}_{i-1,k} + \tilde{H}_{i,k}^\dagger \tilde{y}_i - \sum_{q \in T_i^c \setminus T_{i-1}^c} \tilde{B}_{k,q} \tilde{s}_{i-1,q}$, $k \in T_i$, where $\tilde{B}_{k,q} = \sum_{j=1}^{i} \tilde{G}_{j,k}^\dagger \tilde{G}_{j,q}$ and $\tilde{x}_{i,k} = 0$, $k \notin T_i$.

In Algorithm 2, we leverage our key observations and provide a memory efficient implementation of the optimal Chase-combining with blanking, with and without codeword cancelation.

Process: Efficient Chase Combining With Blanking
1. Initialize i=1, S=0, $\tilde{z}$=0.
2. repeat
3. Obatin $\tilde{y}_i$ and $\tilde{H}_i$, the observations and the channel matrix post-whitening for the $i^{th}$ round.
4. Update $\tilde{S} \to \tilde{S}+\tilde{H}_i^\dagger \tilde{H}_i$ and $\tilde{z} \to \tilde{z}+\tilde{H}_i^\dagger \tilde{y}_i$
5. Use $\tilde{z}$ and $\tilde{S}$ with the model in (6) (when codeword cancelation is not allowed) or the model in (9) (when it is allowed) to demodulate the symbols of codewords in $T_i$ and let $\{l_k\}_{k \in T_i}$ denote the obtained LLR vectors.
6. Use $\{l_k\}_{k \in T_i}$ to decode the codewords in $T_i$.
7. Conduct CRC on each decoded codeword and let U,C denote the sets of users which fail and pass the CRC, respectively.
8. Send an ACK for each user in C and a NACK for each user in U.
9. if Codeword cancelation is allowed then
10 Re-encode and re-modulate all decoded codewords in C.
11. For each user $j \in U$ update $\tilde{z}_j \to \tilde{z}_j - \Sigma_{p \in C} \tilde{S}_{j,p} \tilde{s}_p$.
12. For each $j \in C$ and set $\tilde{z}_j$=0 and set all elements in the rows and columns of $\tilde{S}$ with indices in $\{1+\Sigma_{q=1}^{j-1} n_q, \ldots, \Sigma_{q=1}^{j} n_q\}$ to be zero.
13. end if
14. if i=Q and U≠φ then
15. Declare a packet error for each user in U.
16. end if
17. Update i→i+1 and $T_i$=U.
18. until i>Q or $T_i$=φ

CC-HARQ Without Blanking

We now consider an MCW CC-HARQ system without blanking. In such a system. K≧1 codewords are simultaneously transmitted by the K users, which are then decoded by the receiver. The receiver conducts a cyclic redundancy check (CRC) for every codeword it decodes and sends an ACK to each user whose decoded codeword passed the CRC and a NACK to the remaining ones. Upon receiving a NACK, the user re-transmits its codeword whereas upon receiving an ACK it transmits a new codeword. A packet error is declared for user p if its codeword cannot be successfully decoded after a maximum number, say $M_p$, of transmissions. Thus, K codewords are transmitted in every round. The discrete-time model of the signal received during a symbol interval in the $i^{th}$ round after whitening, can be written as $$\tilde{y}_i = \tilde{H}_i s_i + \tilde{n}_i, \quad (16)$$

where $s_i$ is now a vector containing all non-zero modulated symbols and hence $\tilde{H}_i$ is a matrix with all non-zero columns.

We now consider the optimal Chase-combining without blanking. Recall that we refer to a round as a regeneration round if K new codewords are transmitted during that round. Then consider the $i^{th}$ round and let t≦i be the index of the most recent regeneration round. First supposing that cancelation of codewords from the received observations is not possible, we cam write the concatenated received sufficient statistics as, $$\tilde{y}_{(i)} = [\tilde{y}_t; \ldots ; \tilde{y}_i] = \underbrace{[\tilde{H}_{(i)}^{eff}, \tilde{H}_{(i)}^{int}]}_{\tilde{F}_{(i)}}[s_i; s_i^{int}] + \tilde{n}_{(i)}, \quad (18)$$

where $s_i=[s_{i,1}; \ldots ; s_{i,K}]$ is the symbol vector transmitted during a symbol interval in the $i^{th}$ round. The symbols not corresponding to the K codewords of the $i^{th}$ round are collected in the vector $s_i^{int}$. On the other hand, consider the case when the correctly decoded codewords can be canceled from the received observations during the time interval between two consecutive rounds. Let $C_{j,i}$, t≦j≦i−1 denote the set of indices of codewords that are transmitted in round j and are correctly decoded prior to the $i^{th}$ round. Then, we can obtain the concatenated received statistics post-cancelation, $[\tilde{y}_t - \Sigma_{k \in C_{t,i}} \tilde{H}_{t,k} \hat{s}_{t,k}; \ldots ; \tilde{y}_{i-1} - \Sigma_{k \in C_{i-1,i}} \tilde{H}_{i-1,k} \hat{s}_{i-1,k}; \tilde{y}_i]$ and expand it as in the RHS of (18), but where $s_i^{int}$ now contains the symbols corresponding to codewords that could not be correctly decoded even after the maximum number of transmissions. The concatenated received sufficient statistics with or without codeword cancelation can be used tor the symbol-level pre-equalization combining. In each case, the SINR at the LMMSE equalizer output is given by $$SINR_{i,k,m}^{eff} = \frac{1}{\left[\left(I + [\tilde{H}_{(i)}^{eff}, \tilde{H}_{(i)}^{int}]^\dagger [\tilde{H}_{(i)}^{eff}, \tilde{H}_{(i)}^{int}]\right)^{-1}\right]_{e_k+m, e_k+m}} - 1,$$

$$\forall \; 1 \leq m \leq n_k \; \& \; k \in \{1, \ldots, K()1$$

after using the appropriate $$\tilde{H}_{(i)}^{eff}, \tilde{H}_{(i)}^{int} e_k = \sum_{j=1}^{k-1} n_j, \forall \; k \geq 1 \; \text{with} \; e_1 = 0.$$

The major drawback in using concatenated received statistics (with or without codeword cancelation) for symbol-level combining is that in order to perform this type of combining, the receiver must store all the received observations and channel matrices starting from the most recent regeneration round. This is because the received observations starting from the most recent regeneration round to the current round are not mutually independent and hence must be jointly processed. Moreover, for any positive maximum codeword re-transmission limit, the memory required may grow unbounded since the number of rounds between two consecutive regeneration rounds is not bounded, making such a combining scheme impractical. Unfortunately, in this case no memory efficient implementations for the optimal combining seem possible. Nevertheless, we consider the case when codeword cancelation is possible and suggest an efficient receiver that leverages both bit-level combining and pre-equalization symbol-level combining and limits memory consumption and complexity to that of the conventional combiner.

An Efficient Technique For Chase Combining Without Blanking

In order to describe our efficient technique, we suppose round 1 to be a regeneration round and assume that there have been no packet errors upto round i. Then, recalling our observation that without loss of optimality, we can re-encode and subtract the correctly decoded codewords from the received vectors, the received sufficient statistics at round i, post-subtraction, can be written as $$\tilde{q}_{(i)} = \begin{bmatrix} \tilde{y}_1 - \sum_{k \in c_{1,i}} \tilde{H}_{1,k} \hat{s}_{1,k}; \dots ; \\ \tilde{y}_{i-1} - \sum_{k \in c_{i-1,i}} \tilde{H}_{i-1,k} \hat{s}_{i-1,k}; \tilde{y}_i \end{bmatrix} = \tilde{H}^{\text{eff}}_{(i)} s_i + \tilde{n}_{(i)}. \quad (20)$$

Then, note that in the absence of packet errors and with codeword cancelation, $(\tilde{H}_{(i)}^{\text{eff}})^{\dagger} \tilde{q}_{(i)}$ represents sufficient statistics to decode the codewords of the K users in round i. Consequently, the pre-equalization symbol-level combining can be done in a memory efficient way, in a manner similar to that used in the efficient technique described for blanking with codeword cancelation. Next, on decoding the K codewords and conducting CRC on each decoded codeword, we obtain the sets $U_i$ & $C_i$, which denote the sets of codeword indices which fail and pass the CRC step in round i, respectively. Let there be a user $k \in U_i$ such that $q_k = M_k$, i.e., there is a user k which has been decoded in error and for whom the maximum transmission limit has been reached. Consequently, we declare a packet error for user k. Suppose also that there is at least one user in $U_i$ which has not reached its maximum transmission limit. However, since the codeword corresponding to user k cannot be perfectly canceled, the sufficient statistics for the next (i+1) round will involve more than $\sum_{j=1}^{K} n_j$ input symbols. In particular, we will have $$\tilde{q}_{(i+1)} = \begin{bmatrix} \tilde{y}_1 - \sum_{k \in c_{1,i+1}} \tilde{H}_{1,k} \hat{s}_{1,k}; \dots ; \\ \tilde{y}_i - \sum_{k \in c_{i,i+1}} \tilde{H}_{i,k} \hat{s}_{i,k}; \tilde{y}_{i+1} \end{bmatrix} \quad (21)$$
$$= [\tilde{H}^{\text{eff}}_{(i+1)}, \tilde{H}^{\text{int}}_{(i+1)}][s_{i+1}; s^{\text{int}}_{i+1}] + \tilde{n}_{(i+1)}$$

where $s_{i+1}^{\text{int}}$ consists of all symbols belonging to the codewords in $U_i$ for whom a packet error was declared. Then, to limit demodulation complexity as well as memory requirement to that of the conventional combiner, we make the following approximation in our receiver. We exploit bit-level combining for all codewords in $U_i$ which have not reached their maximum transmission limits. In particular, we first store the LLRs computed for these codewords thus far and we assume the next round i+1 to be a regeneration round. Under this assumption pre-equalization symbol-level combining is done in all subsequent rounds. Specifically, for round i+1 we use only the observations $\tilde{y}_{i+1}$, whereas for any non-regeneration round t>i+1 such that no packet errors have occurred in rounds i+1 to t−1, we use the following received observations $$\tilde{q}_{(t)} = \begin{bmatrix} \tilde{y}_{i+1} - \sum_{k \in c_{i+1,t}} \tilde{H}_{i+1,k} \hat{s}_{i+1,k}; \dots ; \\ \tilde{y}_{t-1} - \sum_{k \in c_{t-1,t}} \tilde{H}_{t-1,k} \hat{s}_{t-1,k}; \tilde{y}_t \end{bmatrix} = \tilde{H}^{\text{eff}}_{(t)} s_t + \tilde{n}_{(t)}. \quad (22)$$

A set of LLRs are computed in a memory efficient way using $(\tilde{H}_{(t)}^{\text{eff}})^{\dagger} \tilde{q}_{(t)}$. The LLRs so obtained are used to decode all codewords in round t except those that were also transmitted during round i. For the latter set of codewords, the LLRs fed to their decoders are the sums of the obtained LLRs and the corresponding LLRs stored at the end of round i. Note that subsequent equalization (demodulation) does not use the received observations and channel matrices corresponding to rounds prior to i+1 and hence these can be discarded. Finally for any regeneration round t, without loss of optimality, we use only the received observations $\tilde{y}_t$. Note that in contrast to the aforementioned approach, in conventional Chase combining we do bit-level combining for all codewords irrespective of how many times they have been transmitted. Our efficient technique is described in detail in the algorithm given below.

Process Efficient Chase Combining Without Blanking

1. Initialize $\{L_k = 0, q_k = 0\}_{k=1}^{K}$, $t = 0$, $\tilde{z} = 0$.
2. while $t \leq T_{\text{finish}}$ do
3. Update $t \to t+1$ and obtain $\tilde{y}_t$ and $\tilde{H}_t$, the observations and the channel matrix post-whitening for the $t^{\text{th}}$ round.
4. Update $\tilde{S} \to \tilde{S} + \tilde{H}_t^{\dagger} \tilde{H}_t$ and $\{q_k \to q_k + 1\}_{k=1}^{K}$; $\tilde{z} \to \tilde{z} + \tilde{H}_t^{\dagger} \tilde{y}_t$.
5. Use $\tilde{z}$ and $\tilde{S}$ to demodulate the symbols of the K codewords and let $\{l_k\}_{k=1}^{K}$ denote the obtained LLR vectors.
6. Update $\{l_k \to L_k + l_k\}_{k=1}^{K}$ and use the updated LLRs to decode the K codewords.
7. Conduct CRC on each decoded codeword and let U,C denote the sets of users which fail and pass the CRC, respectively.
8. Send an ACK for each user in C and a NACK for each user in U.
9. For each $i \in C$ and set $\tilde{z}_i = 0$, $q_i = 0$ & $L_i = 0$.
10. if there is a user $p \in U$ such that $q_p = M_p$ then
11. For each user $p \in U$ such that $q_p = M_p$, declare a packet error and set $\tilde{z}_p = 0$, $q_p = 0$ & $L_p = 0$.
12. For each user $p \in U$ such that $q_p < M_p$, set $L_p = l_p$.
13. Set $\tilde{S} = 0$, $\tilde{z} = 0$.
14. else
15. For each user $i \in U$ update $\tilde{z}_i \to \tilde{z}_i - \sum_{p \in C} \tilde{S}_{i,p} \tilde{s}_p$,
16. For each user $i \in C$ and set all elements in the rows and columns of $\tilde{S}$ with indices in $\{1 + \sum_{q=1}^{i-1} n_q, \dots, \sum_{q=1}^{i} n_q\}$ to be zero.
17. end if
18. end while SINR Feedback For Chase Combining In this section, we consider systems employing chase combining and with a limited feedback link between the receiver and each user. Our objective is to compute and feed back an SINR at the start of any round to each user who is supposed to transmit a new codeword in that round. This allows the users to use rates that are well-matched to their received SINRs and hence improve the system throughput. The underlying assumption is that, channel estimate for all users are available at the start of a round and hence the scheme is more practical in a low-mobility scenario where each user's channel stays approximately constant for the duration of a round and the feedback delay is well within the coherence time.

First, let us consider chase combining with blanking. In such a system. SINRs can be fed back only at the start of a re-generation round in which all the K users transmit new codewords. This is because in other rounds users either remain silent or re-transmit their codewords and hence cannot alter their rates. Then, as a result of the fact that all the information obtained prior to the regeneration round has no further utility, the SINR computation is identical for the conventional as well as the optimal chase-combiners (with or without codeword cancelation). For instance, assuming an LMMSE equalizer and round i to be a regeneration round the SINRs for both pre and post-equalization symbol-level combining are given by, $$SINR_{i,k,m}^{feedback} = \frac{1}{\left[\left(I + \tilde{H}_i^\dagger \tilde{H}_i\right)^{-1}\right]_{e_k+m,e_k+m}} - 1,$$

$$\forall\, 1 \le m \le n_k\ \&\ k \in \{1, \ldots, K\}.$$

Note that the $n_k$ SINRs of the $k^{th}$ user can also be combined into one effective SINR using standard methods such as EESM or MIESM [14].

Next, let us consider systems employing chase combining without blanking. Now at the start of any round we can feedback an SINR to each user who is supposed to transmit a new codeword in that round. Suppose an LMMSE equalizer is used and that user k is eligible for SINR feedback at the stunt of round i, i.e., at the end of round i−1 either user k received an ACK or reached its maximum codeword transmission limit. Then the SINR for post-equalization symbol-level combining can be computed using (17) after setting q=1. On the other hand, with pre-equalization symbol-level combining the SINR can be computed using (19). The key difference between the two SINR computations is that in the pre-equalization symbol-level combining case we exploit the information about the interference, i.e., the codewords transmitted by other users, that is present in the previous received observations. As before, it can be shown that the SINR obtained for pre-equalization symbol-level combining with codeword cancelation is larger than the SINR obtained for pre-equalization symbol-level combining without codeword cancelation, which in turn is larger than the SINR obtained for post-equalization symbol-level combining.

As mentioned before, the optimal pre-equalization symbol-level combining for CC-HARQ without blanking entails a large memory overhead. Consequently, we next incorporate SINR computation and feedback in our efficient technique given in the above process, after assuming that an LMMSE equalizer is used. Moreover, we also generalize it in the following manner, Recall that in the method used in the above process, upon occurrence of a packet error even, we reset the buffers after storing the appropriate LLRs and assume the next round to be a regeneration round. We can indeed extend this method at the expense of additional memory and complexity. In particular, we define a parameter $P \geq 0$ that is used to control the memory and complexity overheads. Then at the start of any round i, if the number of packet errors (starting from the recent-most regeneration round) does not exceed P, we can write the concatenated received observations as in (18), where $s_i^{int}$ is empty and reset the buffers after storing the appropriate LLRs, i.e., the LLRs of the codewords that will be re-transmitted in the current round. We present the generalized process, where for convenience we assume that all users have an identical number of transmit antennas $n_k = n$, $\forall\, k$ Process: Efficient Chase Combining Without Blanking: SINR Feedback

---

1: Initialize $\{L_k = 0, q_k = 0\}_{k=1}^K$, $t = 0$, $c = 0$, $\tilde{F} = 0$, $\tilde{z} = 0$.
2: while $t \le T_{finish}$ do
3: Update $t \to t + 1$ and obtain the channel matrix post-whitening for the $t^{th}$ round, $\tilde{H}_t$.
4: Update $\tilde{F} \to \tilde{F} + [\tilde{H}_t\ 0]^\dagger[\tilde{H}_t\ 0]$ and $\{q_k \to q_k + 1\}_{k=1}^K$.
5: For each k: $q_k = 1$, compute and feedback $SINR_{t,k,m} =$ $$\frac{1}{[(I+F)^{-1}]_{e_k+m,e_k+m}} - 1$$

6: Obtain the received observations post-whitening, $\tilde{y}_t$ and update $\tilde{z} \to \tilde{z} + [\tilde{H}_t\ 0]^\dagger \tilde{y}_t$.

7: Use $\tilde{z}$ and $\tilde{F}$ to demodulate the symbols of the K codewords and let $\{l_k\}_{k=1}^K$ denote the obtained LLR vectors.
8: Update $\{l_k \to L_k + l_k\}_{k=1}^K$ and use the updated LLRs to decode the K codewords.
9: Conduct CRC on each decoded codeword and let U, C denote the sets of users which fail and pass the CRC, respectively.
10: Send an ACK for each user in C and a NACK for each user in U.
11: For each $i \in C$ and set $\tilde{z}_i = 0$, $q_i = 0$ & $L_i = 0$.
12: Compute G, the number of users $p \in U$ such that $q_p = M_p$
13: if $c + G > P$ then
14: For each user $p \in U$ such that $q_p = M_p$, declare a packet error and set $\tilde{z}_p = 0$, $q_p = 0$ & $L_p = 0$.
15: For each user $p \in U$ such that $q_p < M_p$; set $L_p = l_p$.
16: Set $\tilde{F} = 0$, $\tilde{z} = 0$, $c = 0$.
17: else
18: For each user $i \in U$ update $\tilde{z}_i \to \tilde{z}_i - \Sigma_{p \in C} \tilde{F}_{i,p} \hat{s}_p$.
19: For each user $i \in U$: $q_i = M_i$, declare a packet error for user i, increment $c \to c + 1$, swap $\tilde{z}_i$ with the subvector of $\tilde{z}$ formed by its elements with indices in $\{n(i − 1) + 1, \ldots, ni\}$, swap each row k and column k of $\tilde{F}$, where $k \in \{n(i − 1) +, \ldots, ni\}$ with row $nK + n(c − 1) + k − n(i − 1)$ and column $nK + n(c − 1) + k − n(i − 1)$ of $\tilde{F}$, respectively.
20: For each user $i \in C$ set all elements in the rows and columns of $\tilde{F}$ with indices in $\{n(i − 1) + 1, \ldots, ni\}$ to be zero.
21: end if
22: end while

---

The key feature of the inventive receiver techniques is that both post-demodulation bit-level combining as well as pre-equalization symbol level combining are exploited to achieve a superior performance compared to the conventional chase combining receiver, with a comparable memory and complexity requirement. In particular, in each round an effective channel matrix and decision statistics are recursively updated and are subsequently used for demodulation. The resulting LLRs are combined with corresponding previously stored estimates and used for decoding. Based on the results of the CRC and the number of decoding errors that have previously been made for each codeword, the effective channel matrix and decision statistics are again updated and stored along with a set of LLRs.

The present invention has been shown and described in what are considered to be the most practical and preferred embodiments. It is anticipated, however, that departures may be made therefrom and that obvious modifications will be implemented by those skilled in the art. It will be appreciated that those skilled in the art will be able to devise numerous arrangements and variations, which although not explicitly shown or described herein, embody the principles of the invention and are within their spirit and scope.

What is claimed is:

1. A method for decoding of multiple wireless signals by a chase combining hybrid-automatic-repeat-request CC-HARQ receiver, comprising the steps of:
   demodulating wireless signals received from respective mobile sources using an effective channel matrix and decision statistics;
   updating log-likelihood-ratios LLRs and decoding the received codewords using the corresponding updated LLRs;
   determining set of correctly decoded codewords using a cyclic redundancy check;
   updating the effective channel matrix and decision statistics responsive to the step of determining; and
   resetting the effective channel matrix and decision statistics, in the event that the number of decoding errors for a codeword exceeds its maximum limit, after storing the updated LLRs of all remaining erroneously decoded codewords for which the number of decoding errors is below the respective maximum limit.

2. The method of claim 1, wherein the effective channel matrix and decision statistics are recursively updated pre-demodulation using their previously stored values and the current channel matrix and received observations.

3. The method of claim 1, wherein the effective channel matrix and decision statistics are recursively updated post decoding after reconstructing the correctly decoded codewords.

4. The method of claim 1, wherein the LLRs are updated by combining the current LLR estimates with the corresponding estimates stored when the number of decoding errors for a codeword exceeds its maximum limit.

5. The method of claim 1, wherein the receiver may choose not to demodulate and decode some or all of the codewords and decide that these codewords were decoded erroneously.

6. The method of claim 1, further comprising the step of transmitting back to a respective mobile user a signal-to-noise-ratio responsive to a correct decoding of a signal from the respective mobile source.

7. The method of claim 6 wherein the signal-to-noise-ratio is computed using the updated effective channel matrix, the channel estimates for the next round and the fact that the erroneously decoded codewords that have not reached their maximum respective repetition limits will be re-transmitted.

8. The method of claim 1, further comprising the step of transmitting back to a respective mobile user a signal-to-noise-ratio responsive to a packet error being declared for the signal from the respective mobile source.

* * * * *